United States Patent
Kim et al.

[11] Patent Number: 5,907,783
[45] Date of Patent: *May 25, 1999

[54] METHOD OF FABRICATING SILICON-ON-INSULATOR SUBSTRATE

[75] Inventors: Jin-Hyoung Kim; Kyoon-Hyoung Kim; Han-Sub Yoon, all of Ich'on, Rep. of Korea

[73] Assignee: Hyundai Electronics Industries Co., Ltd., Kyoungki-do, Rep. of Korea

[ * ] Notice: This patent issued on a continued prosecution application filed under 37 CFR 1.53(d), and is subject to the twenty year patent term provisions of 35 U.S.C. 154(a)(2).

[21] Appl. No.: 08/773,163

[22] Filed: Dec. 26, 1996

[30] Foreign Application Priority Data

Dec. 30, 1995 [KR] Rep. of Korea ............... 95-69459

[51] Int. Cl.$^6$ ................................................. H01L 21/76
[52] U.S. Cl. ................... 438/407; 438/410; 438/692
[58] Field of Search ........................... 438/410, 407, 438/FOR 222, 692

[56] References Cited

U.S. PATENT DOCUMENTS

| | | |
|---|---|---|
| 4,361,600 | 11/1982 | Brown . |
| 4,502,913 | 3/1985 | Lechaton et al. . |
| 4,561,932 | 12/1985 | Gris et al. . |
| 4,604,162 | 8/1986 | Sobczak . |
| 4,615,746 | 10/1986 | Kawakita et al. . |
| 4,685,198 | 8/1987 | Kawakita et al. . |
| 4,692,996 | 9/1987 | Minato . |
| 4,700,454 | 10/1987 | Baerg et al. . |
| 4,845,048 | 7/1989 | Tamaki et al. . |
| 5,212,397 | 5/1993 | See et al. . |
| 5,270,265 | 12/1993 | Hemmenway et al. . |
| 5,344,524 | 9/1994 | Sharma et al. . |
| 5,434,444 | 7/1995 | Nakagawa et al. ............ 257/487 |
| 5,470,781 | 11/1995 | Chidambarrao et al. . |
| 5,512,509 | 4/1996 | Han . |

FOREIGN PATENT DOCUMENTS

| | | |
|---|---|---|
| 0525256 | 7/1991 | European Pat. Off. . |
| 0485720 | 9/1991 | European Pat. Off. . |
| 0615286 | 3/1994 | European Pat. Off. . |
| 54-83783 | 7/1979 | Japan . |
| 59-188938 | 10/1984 | Japan . |
| 60-68628 | 4/1985 | Japan . |
| 62-101034 | 5/1987 | Japan . |
| 2-39434 | 2/1990 | Japan . |
| 5-267661 | 10/1993 | Japan . |
| 5-366680 | 12/1993 | Japan . |
| 7-321194 | 12/1995 | Japan . |
| 94-05037 | 3/1994 | WIPO . |

OTHER PUBLICATIONS

IBM Tech. Disc. Bull., vol. 27, No. 11, pp. 6703–6704, Apr. 1985.

Sundaram, S.L., et al., "Novel Isolation Process . . . Bipolar Circuits", IEEE 1990 Bipolar Circ. and Tech. Meeting, 1.2, pp. 26–28, 1990.

*Primary Examiner*—George Fourson
*Attorney, Agent, or Firm*—Ware, Fressola, Van Der Sluys & Adolphson LLP

[57] ABSTRACT

A method of fabricating a SOI substrate is disclosed, which includes the steps of: forming trenches in the Si substrate; forming an oxidation preventing film over the Si substrate and at the side-walls of the trenches; forming grooves at the bottoms of trenches by etching the Si substrate using the oxidation preventing film as a mask; carrying out an oxidation using to form an oxide film and a Si device layer isolated by the oxide film; removing the oxidation preventing film; and carrying out a planarization to form the silicon-on-insulator substrate having a planar surface.

8 Claims, 5 Drawing Sheets

METHOD OF FABRICATING SILICON-ON-INSULATOR SUBSTRATE

BACKGROUND OF THE INVENTION

The present invention relates to a silicon-on-insulator ("SOI") substrate and method of fabricating the same, and more particularly to a SOI substrate and method of fabricating the same including a Si device layer having a constant thickness.

In general, in a fabrication process of a complementary metal oxide semiconductor ("CMOS") transistor, an isolation region of a large area should is needed in order to isolate devices and prevent latch-up of a CMOS transistor. There are, however, problems in that an isolation region of a large area results in a reduced chip dimension and a reduced integration of devices.

A SOI technique had been proposed in order to above problems. With complete isolation between devices, a SOI substrate, having a buried oxide film sandwiched between a Si handling substrate and a Si device substrate, prevents latch-up of a CMOS transistor and allows for high operational speed of devices.

One fabrication method of the SOI substrate is a separation by implanted oxygen ("SIMOX") method. In a conventional SIMOX technique, referring to FIG. 1A, there is a Si substrate 1 doped with impurity ions. Oxygen ions are implanted into the substrate 1. Referring to FIG. 1B, an annealing is carried out to form a buried oxide film 2 and a Si device layer 1A in the Si substrate 1. Referring to FIG. 1C, a field oxide 3 is formed in the Si device layer 1A by a LOCOS, thereby forming a SOI substrate 100.

However, the conventional SIMOX technique has a disadvantage in that dislocation in a surface of a Si layer easily occurs when implanting oxygen ions, thereby generating a great quantity of leakage current. Therefore, it is difficult to control a thickness of the Si layer where a device is to be formed.

Another method of fabrication is a bonding technique. In conventional bonding technique, referring to FIG.2A, there are provided a Si device substrate 10 and a handling substrate 11. A buried oxide film 12 is formed on the handling substrate 11 by a thermal oxidation. Referring to FIG. 2B, the handling substrate 11 and the device substrate 10 are bonded, with the buried oxide film 12 existing between substrates 10 and 11. Afterwards, most of the device substrate 10 is etched by grinding and lapping and then the ground and lapped device substrate 10 is chemical and mechanical polished to high degree of precision, thereby forming a Si device layer 10A. Referring to FIG. 2C, an isolation film 13 is formed in the Si device layer 10A to define an active region, thereby forming a SOI substrate 200 having a Si device layer 10A.

According to the conventional bonding technique, it is difficult to precisely control a polishing stop point in chemical and mechanical polishing to form the Si device layer 10A. Since, the thickness of the Si device layer 10A is not constant, yield of semi-conductor devices is reduced. In addition, the conventional bonding technique has disadvantages of a complicated fabrication process and high fabrication cost. Furthermore, the conventional techniques have a shortcoming in that a separate additional process, which forms a field oxide in a Si device layer, is required in order to define an active region.

SUMMARY OF THE INVENTION

An object of the present invention is to provide a method of fabricating a SOI substrate having a Si device layer where the surface is not damaged.

Another object of the present invention is to provide a method of fabricating a SOI substrate with a simplified process.

Another object of the present invention is to provide a method, of fabricating a SOI substrate, which simultaneously forms an isolation film and a buried oxide film.

In accordance with one embodiment, there is provided a method of fabricating a SOI substrate, comprising the steps of: forming trenches in the Si substrate; forming an oxidation preventing film over the Si substrate and at the sidewalls of the trenches; forming grooves at the bottoms of trenches by etching the Si substrate using the oxidation preventing film as a mask; carrying out an oxidation to form an oxide film and a Si device layer isolated by the oxide film; removing the oxidation preventing film; and carrying out a planarization to form the silicon-on-insulator having a planar surface.

In addition, there is also provided a SOI substrate including a Si substrate; a Si device layer formed over the Si substrate to isolate Si device layer from the substrate, the insulating layer being coplanar with the device layer.

BRIEF DESCRIPTION OF THE DRAWINGS

The objects and feature of the invention may be better understood with reference to the following detailed description, appended claims, and attached drawings wherein:

DETAILED DESCRIPTION OF THE INVENTION

Figure 1A:
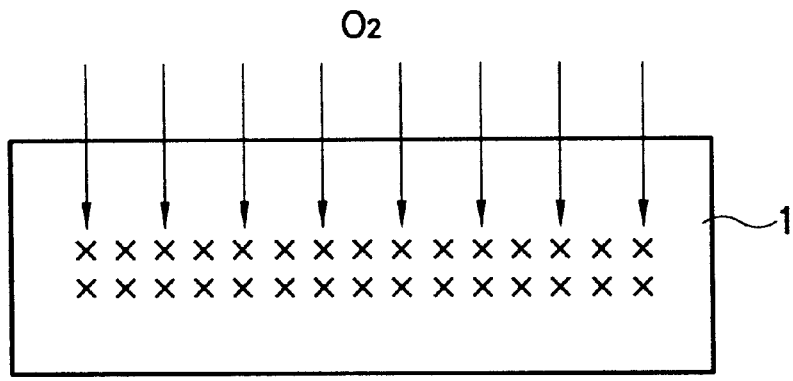
FIG. 1A through FIG. 1C are sectional views illustrating a process of fabricating a SOI substrate according to a conventional SIMOX technique.
Figure 1B:
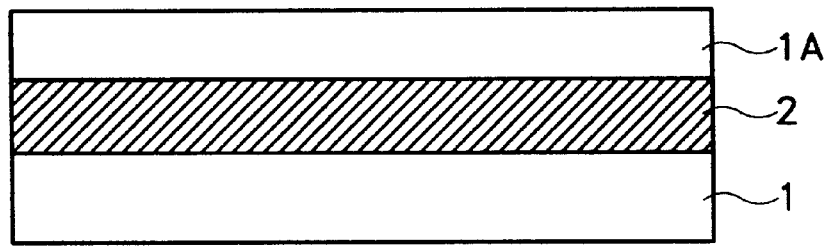
Figure 1C:
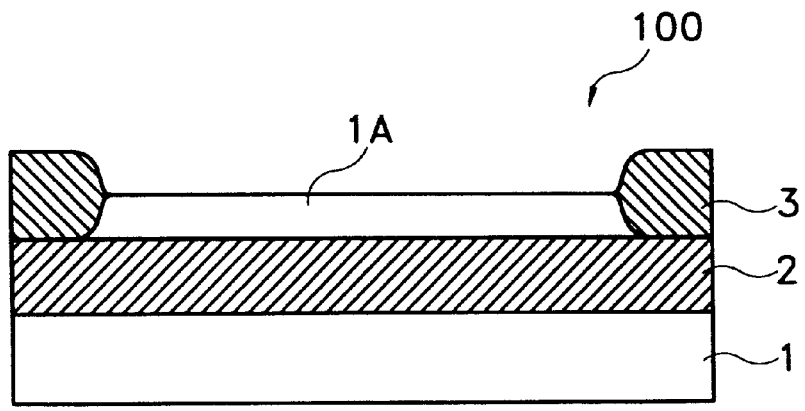
Figure 2A:
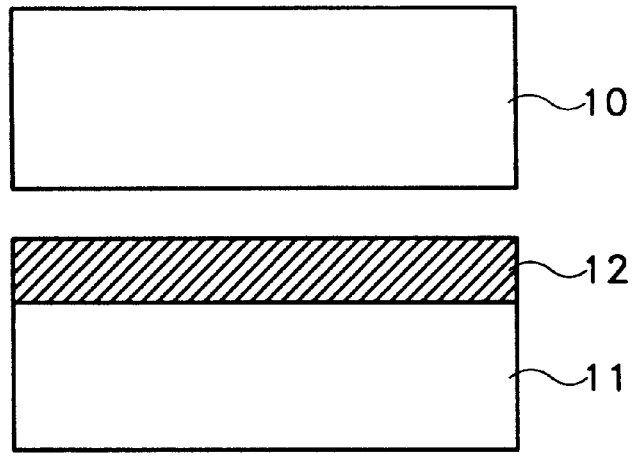
FIG. 2A through FIG. 2C are sectional views illustrating a process of fabricating a SOI substrate according to a conventional boning technique.
Figure 2B:
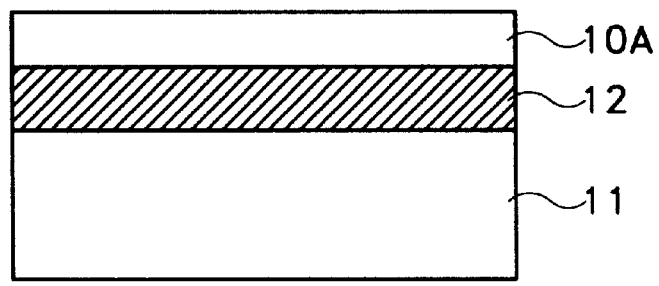
Figure 2C:
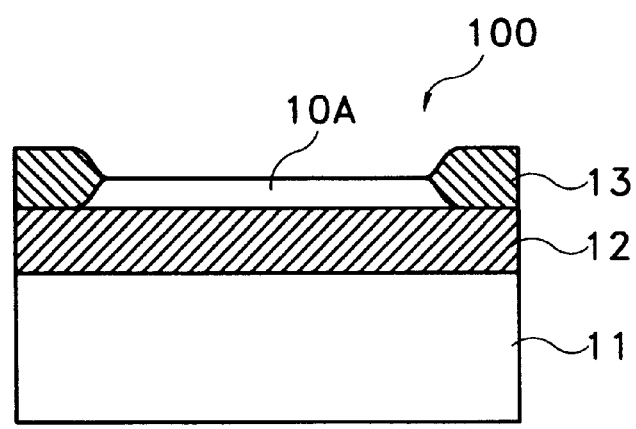
Figure 3A:
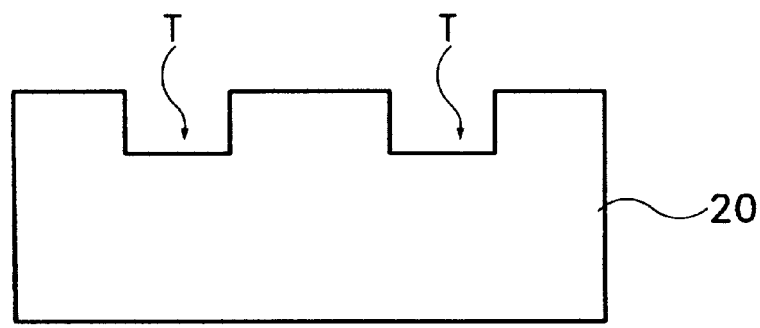
FIG. 3A through FIG. 3F are sectional views illustrating a process of fabricating a SOI substrate in accordance with one embodiment of the present invention.

Referring to FIG. 3A, in accordance with one embodiment of the present invention, trenches T are formed by an anisotropic etching method at the portion of the Si substrate 20 where an isolation film is to be formed, the Si substrate being doped with impurity ions.

Figure 3B:
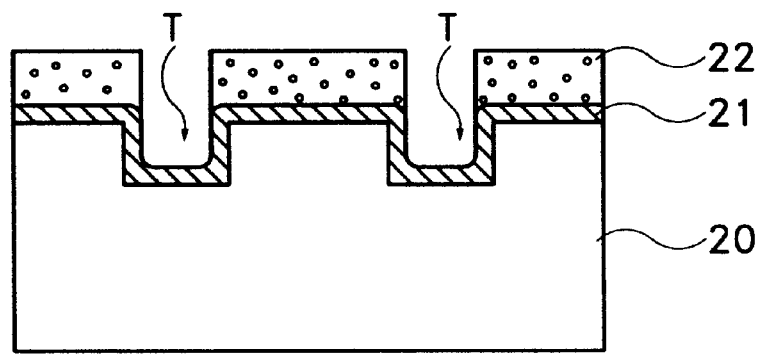

Referring to FIG. 3B, silicon nitride layer 21, which serves as a layer for preventing oxidation, is deposited to a predetermined thickness over the Si substrate 20 including trenches T. A photoresist pattern 22 is formed by depositing a photoresist layer and then exposing portions of the silicon nitride layer 21 existing over the bottoms of the trenches T by a conventional photolithography method. Herein, a pad oxide (not shown) may be formed between the Si substrate 20 and the silicon nitride layer 21 in order to reduce stress due to a difference in coefficients of thermal expansion between the Si substrate 20 and the silicon nitride layer 21.

Figure 3C:
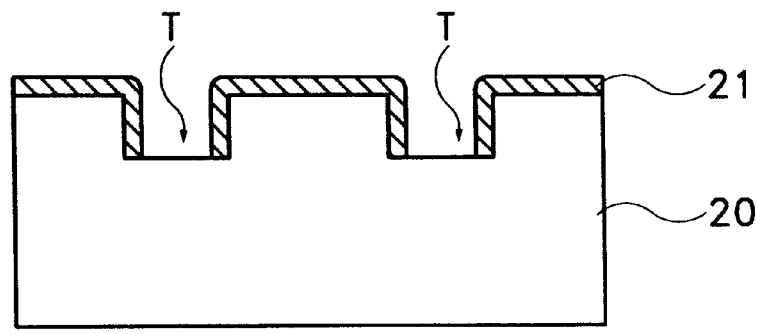

Referring to FIG. 3C, the resultant structure is then anisotropic etched, removing the photoresist pattern 22 and the exposed portions of the silicon nitride layer 21, thereby exposing the Si substrate 20 at the bottom of the trenches.

Figure 3D:
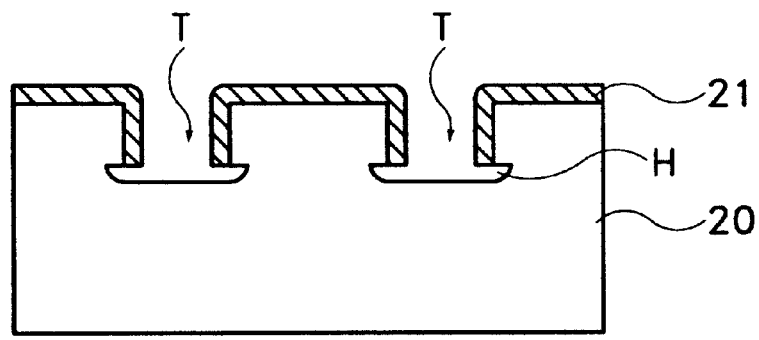

Referring to FIG. 3D, the exposed Si substrate 20 is isotropic etched by using the silicon nitride layer 21 as a mask to form grooves H at a bottom of trenches T. Furthermore, the exposed Si substrate 20 at the bottom of the trenches T is side-etched from the isotropic etching method, etching an bottom area wider than that of the original trenches to thereby narrow the distance between adjacent trenches T.

Figure 3E:
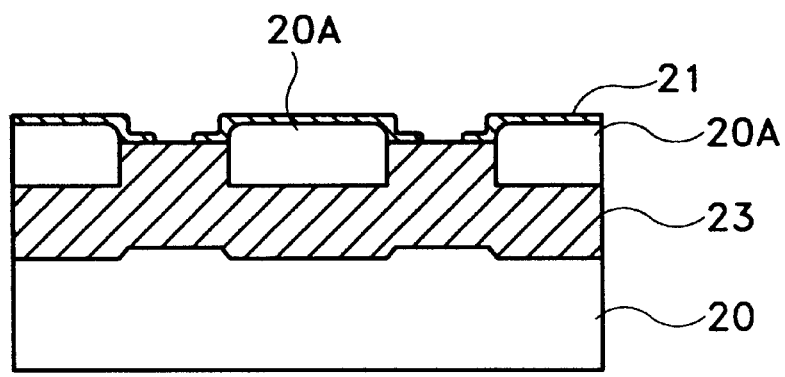

Referring to FIG. 3E, the Si substrate 20 is thermal-oxidized to form an oxide film 23 and a Si device layer 20A which is isolated by the oxide film 23.

Figure 3F:
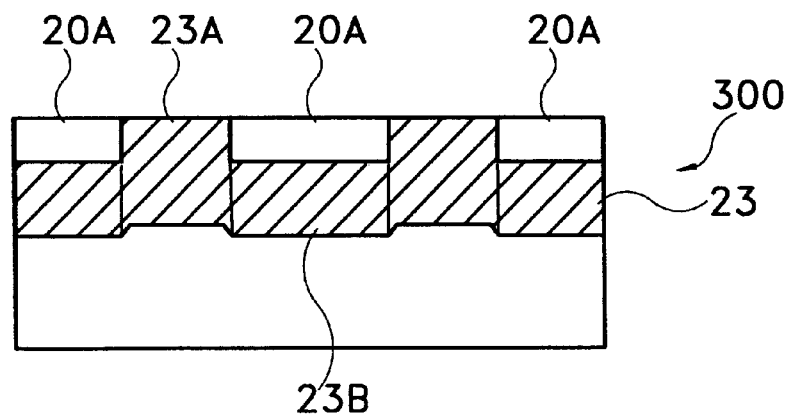

Referring to FIG. 3F, the silicon nitride layer 21 and the Si device layer 20A are etched away until the surface of the oxide film 23 is exposed, thus removing the silicon nitride layer 21. The etching is done by chemical and mechanical polishing or etching back to form a SOI substrate 300 having an planar surface. Herein, the portion 23A of the oxide film 23 existing between adjacent Si device layer 20A serves as an field oxide for an isolation of a SOI substrate. In addition, the portion 23B of the oxide film 23 existing in the Si substrate 20 underlying the Si device layer 20A, serves as a buried oxide of the SOI substrate. According to the present invention, the buried oxide 23B and a field oxide 23A for an isolation are simultaneously formed.

Figure 4:
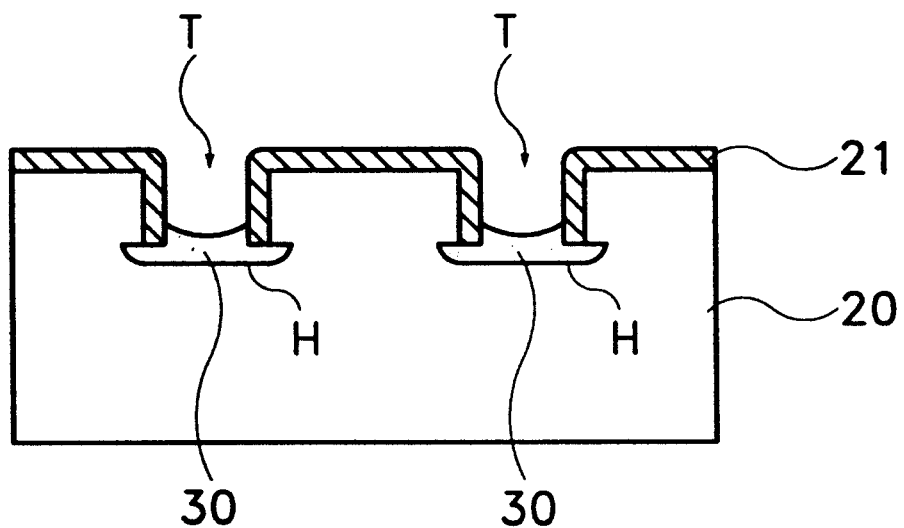
FIG. 4 is a sectional view illustrating a process of fabricating a SOI substrate in accordance with another embodiment of the present invention.

Referring to FIG. 4, in accordance with another embodiment of the present invention, in order to hasten a thermal oxidation for forming the oxide 23, a polysilicon layer 30 is formed at the grooves H in the bottom of trenches T, before thermal oxidation of FIG. 3D. If thermal oxidation is then carried out, with using the polysilicon layer 30 as silicon providing layer, the oxide film 23 is formed at a thickness sufficient to approach at the surface of the Si substrate 20 as shown in FIG. 3E.

Figure 5:
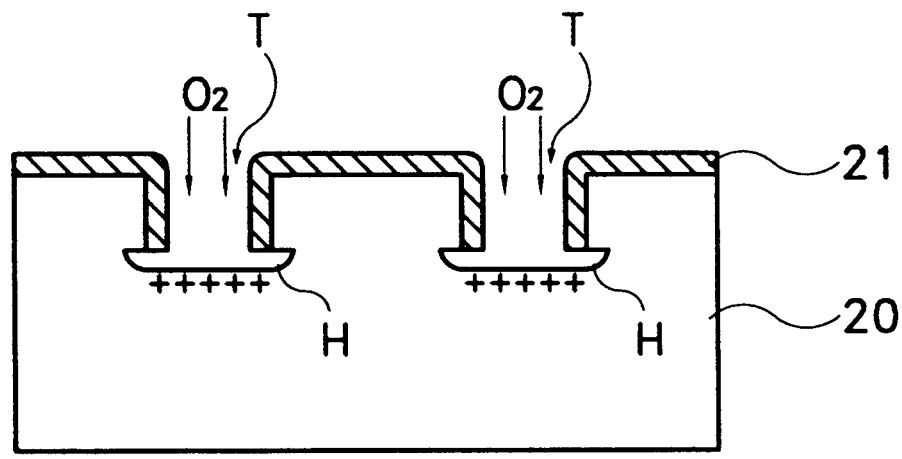
FIG. 5 is a sectional view illustrating a process of fabricating a SOI substrate in accordance with further another embodiment of the present invention.

Referring to FIG. 5, in accordance with further another embodiment of the present invention, before thermal oxidation of FIG. 3D, oxygen ions are implanted into the Si device substrate at the grooves H to hasten a thermal oxidation.

According to the present invention, a field oxide for an isolation and a buried oxide are simultaneously formed by a thermal oxidation using trenches and then the surface of a Si substrate is etched back or chemical and mechanical polished, thereby forming a SOI substrate. Accordingly, the SOI substrate is not damaged with exclusion of an ion implantation for forming a buried oxide in SIMOX as well as a fabrication process is simplified.

While this invention has been described with reference to illustrative embodiments, this description is not intended to be construed in a limiting sense. Various modifications of the illustrative embodiments, as well as other embodiments of the invention, will be apparent to persons skilled in the art upon reference to this description. It is therefore contemplated that the appended claims will cover any such modifications or embodiments as fall within the true scope of the invention.

What is claimed is:

1. A method of fabricating a silicon-on-insulator substrate, comprising the steps of:

forming trenches in a Si substrate, said trenches each having a side-wall and a bottom;

forming an oxidation preventing film over said Si substrate and the side-walls of said trenches;

forming grooves at the bottoms of said trenches by etching said Si substrate using said oxidation preventing film as a mask;

oxidizing said grooves to form an oxide film and a Si device layer completely dielectrically isolated by said oxide film; and planarizing by etchback, thereby removing the oxidation preventing film and exposing the oxide film.

2. The method as claimed in claim 1, wherein said oxidation preventing film is silicon nitride.

3. The method as claimed in claim 1, wherein said step for forming said oxidation preventing film includes the step for:

depositing a silicon nitride over said Si substrate including said trenches;

forming a photoresist pattern to expose said silicon nitride over the bottom of said trenches;

patterning said silicon nitride using said photoresist pattern to form said oxidation preventing film; and removing said photoresist pattern.

4. The method as claimed in claim 3, wherein said step for forming said oxidation preventing film further includes a step for forming a pad oxide over said Si substrate including said trenches, before the step for depositing said silicon nitride.

5. The method as claimed in claim 1, further comprising a step for forming a polysilicon layer at said grooves between said groove formation step and said oxidation step.

6. The method as claimed in claim 1, further comprising a step for implanting oxygen ions into the Si substrate underlying grooves between said groove formation step and said oxidation step.

7. The method as claimed in claim 1, wherein said planarization step is carried out by chemical and mechanical polishing.

8. The method as claimed in claim 1, wherein the step of forming grooves is carried out by isotropic etching.

\* \* \* \* \*